United States Patent
Chen et al.

(10) Patent No.: US 11,671,124 B2
(45) Date of Patent: Jun. 6, 2023

(54) FEEDFORWARD ECHO CANCELLATION DEVICE

(71) Applicant: Realtek Semiconductor Corp., HsinChu (TW)

(72) Inventors: Chien-Wen Chen, HsinChu (TW); Meng-Chun Chang, HsinChu (TW); Chih-Yu Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/667,520

(22) Filed: Feb. 8, 2022

(65) Prior Publication Data
US 2023/0110683 A1    Apr. 13, 2023

(30) Foreign Application Priority Data
Oct. 7, 2021 (TW) ................ 110137312

(51) Int. Cl.
*H04B 1/04* (2006.01)
*H03G 3/30* (2006.01)

(52) U.S. Cl.
CPC ............ *H04B 1/04* (2013.01); *H03G 3/3052* (2013.01); *H03G 2201/103* (2013.01); *H04B 2001/0416* (2013.01)

(58) Field of Classification Search
CPC .... H03F 1/02; H03F 1/56; H03F 3/45; H03G 3/00; H03G 3/30; H03G 3/3052;
(Continued)

(56) References Cited

U.S. PATENT DOCUMENTS 6,472,940 B1 * 10/2002 Behzad ............... H03G 3/3052
330/144
9,385,661 B1    7/2016 Lin
(Continued)

FOREIGN PATENT DOCUMENTS

TW      200527830      8/2005
TW      200533092      10/2005
(Continued)

OTHER PUBLICATIONS

B. Razavi "The R-2Rand C-2C Ladders" IEEE Summer 2019 (Year: 2019).*

*Primary Examiner* — Shawkat M Ali
(74) *Attorney, Agent, or Firm* — Winston Hsu

(57) ABSTRACT

A feedforward echo cancellation device includes: a first impedance circuit for responding to a transmission current to output a first current to a node; an echo cancellation current generating circuit for drawing an echo cancellation current from the node; a circuit module that is coupled to the echo cancellation current generating circuit and the node has a first impedance value adjusted based on a system convergence index of a communication device, where the first impedance value is used to determine a gain of a programmable gain amplifier in the communication device; and a second impedance circuit for responding to the transmission current to output a second current to the node, where a second impedance value of the second impedance circuit is adjusted based on the first impedance value of the circuit module accordingly. Specifically, the node is coupled to an input terminal of the programmable gain amplifier.

10 Claims, 6 Drawing Sheets

(58) Field of Classification Search
CPC ...... H03G 2201/103; H04B 1/04; H04B 1/10; H04B 3/20; H04B 2001/0416
USPC ...... 330/9, 86, 149, 260; 370/276, 286, 290; 375/219, 295–297, 316
See application file for complete search history.

(56) References Cited

U.S. PATENT DOCUMENTS

| | | | |
|---|---|---|---|
| 2005/0232170 A1* | 10/2005 | Chiu | H04L 5/1461 370/276 |
| 2008/0012634 A1 | 1/2008 | Oyang | |
| 2008/0297243 A1* | 12/2008 | Chen | H03F 3/005 330/86 |
| 2022/0276290 A1* | 9/2022 | Novet | A61B 5/7267 |

FOREIGN PATENT DOCUMENTS

| | | |
|---|---|---|
| TW | 200805878 A | 1/2008 |
| TW | I623192 B | 5/2018 |

* cited by examiner

FEEDFORWARD ECHO CANCELLATION DEVICE

BACKGROUND OF THE INVENTION

1. Field of the Invention

The present invention relates to a communication system, and more particularly, to a feedforward echo cancellation device used in a full-duplex communication device.

2. Description of the Prior Art

In a full-duplex communication system, signal transmission and reception will be conducted simultaneously. Therefore, signals received by a receiver of a communication device may include a transmission signal coming from a transmitter of a remote communication device, and an echo signal caused by another transmission signal from a local transmitter. In order to correctly derive information that is intended to be sent by the transmission signal from the remote communication device, the full-duplex communication device usually relies on an echo cancellation device to eliminate the echo in received signals.

The principle of the echo cancellation device is to remove estimation (i.e., an echo cancellation signal) of an echo signal from the received signal. The amplitude of the echo signal depends on the impedance seen by the transmission signal on an output path. Accordingly, the echo cancellation device will simulate the impedance on the output path by using a variable impedance circuit. When a current related to the transmission signal passing through this variable impedance circuit, the echo cancellation signal can be generated. However, as the impedance on the output path includes many different impedances (e.g., the impedance of cable connected to the remote communication device, the impedance of transformer, the impedance of circuit board trace, and the impedance of chip package), the variable impedance circuit in the echo cancellation device often fails to accurately simulate the impedance on the output path. As a consequence, the echo cancellation signal may not match the echo signal in the high-frequency band, so that the echo cancellation device cannot effectively cancel the echo signal in the received signals.

SUMMARY OF THE INVENTION

In view of this, it is one object of the present invention to provide an echo cancellation device, which is operable to cancel echo caused by a transmission signal in a communication device. In embodiments of the present invention, the difference in high-frequency energy between an echo signal and an echo cancellation signal is compensated through a compensation signal. Additionally, the present invention also dynamically adjusts the generating of the compensation signal according to a variation of a system gain, thereby to achieve the best cancellation effect.

According to one embodiment, a feedforward echo cancellation device is provided. The feedforward echo cancellation device comprises: a first impedance circuit, an echo cancellation current generating circuit, a circuit module and a second impedance circuit. The first impedance circuit is coupled to a node, and configured to output a first current to the node in response to a transmission current. The echo cancellation current generating circuit is coupled to the node, and configured to draw an echo cancellation current from the node. The circuit module is coupled to the echo cancellation current generating circuit and the node, wherein a first impedance value of the circuit module is adjusted based on a system convergence index of the communication device, and the first impedance value is utilized to determine a gain of a programmable gain amplifier of the communication device. The second impedance circuit is coupled to the node, and configured to output a second current to the node in response to the transmission current, wherein a second impedance value of the second impedance circuit is adjust based on the first impedance value of the circuit module accordingly. Specifically, the node is coupled to an input terminal of the programmable gain amplifier.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known structures, materials or steps have not been presented or described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1:
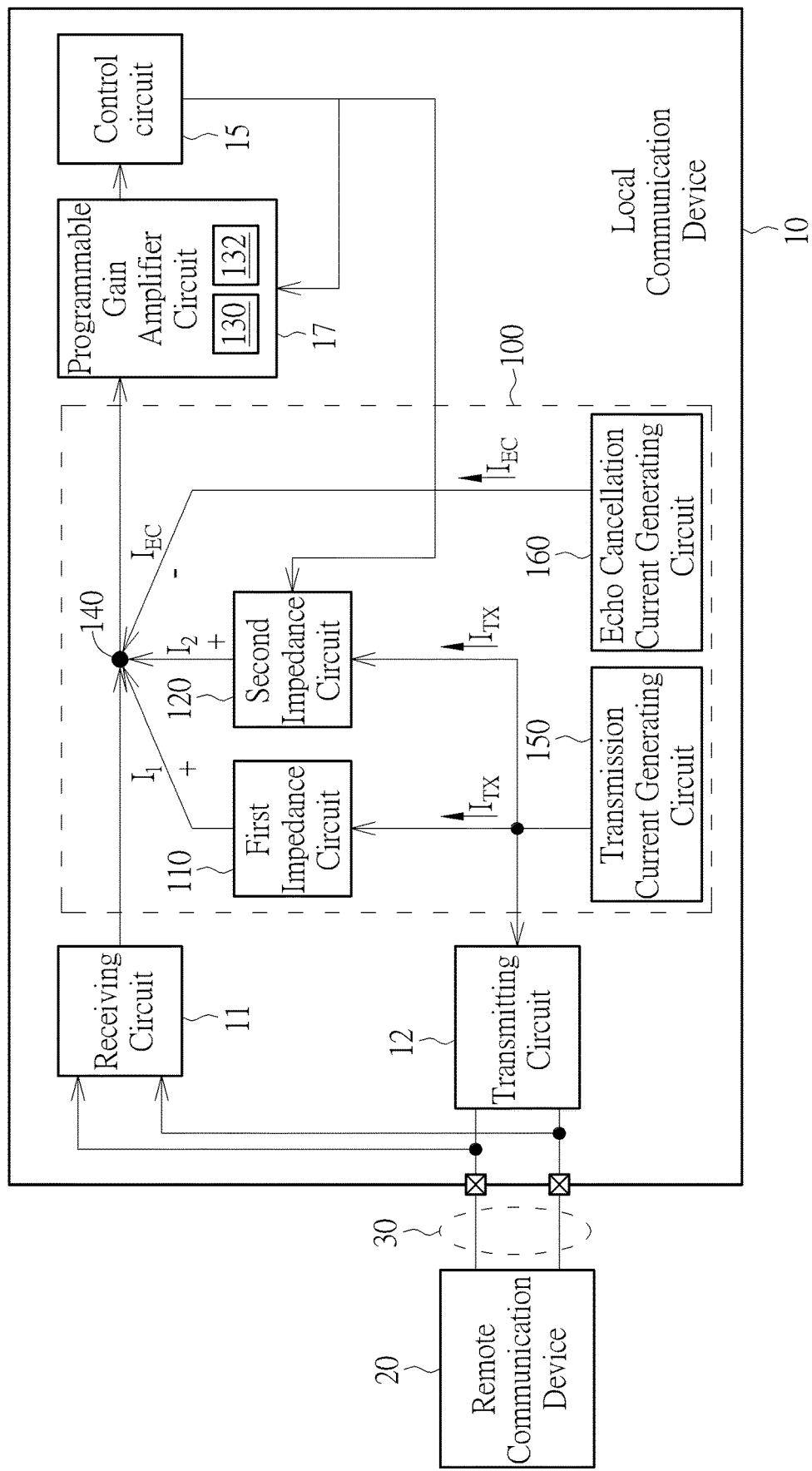
FIG. 1 illustrates a schematic diagram of a feedforward echo cancellation device and an application example according to one embodiment of the present invention.

Please refer to FIG. 1, which illustrates a schematic diagram a feedforward echo cancellation device according to one embodiment of the present invention. The feedforward echo cancellation device 100 can be used in a local communication device 10. A transmitting circuit 12 in the local communication device 10 is operable to transmit a transmission signal to a remote communication device 20 through a transmission cable 30. The transmission signal is driven by a transmission current generating circuit 150. The transmission current generating circuit 150 may include a current-type digital-to-analog converter for converting information that the local communication device 10 intends to send to the remote communication device 20, into an analog signal (i.e., a transmission current $I_{TX}$). The transmission current $I_{TX}$ can be converted into a transmission signal through the transmitting circuit 12. In addition, echo caused by the transmission signal can be received by a first impedance circuit 110 and a second impedance circuit 120 in the feedforward echo cancellation device 100. In order to avoid the determination of the local communication device 10 with respect to received signals being affected, and to accurately reproduce the information sent by the remote communication device 20, the feedforward echo cancellation device 100 is configured to reduce or eliminate the echo caused by the transmission signal.

In this embodiment, the impedance of the first impedance circuit 110 is substantially identical to the impedance encountered by the transmission signal on a path from the local communication device 10 to the remote communication device 20. The transmission current $I_{TX}$ provided by the transmission current generating circuit 150 forms a current $I_1$ after passing through the first impedance circuit 110, and the current $I_1$ can be used to simulate the echo received by a receiving circuit 11. Furthermore, the feedforward echo cancellation device 100 further includes a second impedance circuit 120, a node 140, the transmission current generating circuit 150, and an echo cancellation current generating circuit 160. The second impedance circuit 120 is coupled to the transmission current generating circuit 150, and its impedance is adjustable. The echo cancellation current generating circuit 160 is coupled to the node 140. The impedance on a path from the echo cancellation current generating circuit 160 to the node 140 is also adjustable. The echo cancellation current generating circuit 160 is operable as a current source circuit and configured to draw the echo cancellation current $I_{EC}$ (designated with a minus sign) from the node 140. As the drawn echo cancellation current $I_{EC}$ is associated with the transmission current $I_{TX}$ generated by the transmission current generating circuit 150 to a certain extent, the echo cancellation current $I_{EC}$ can match the current $I_1$ as much as possible.

Figure 2:
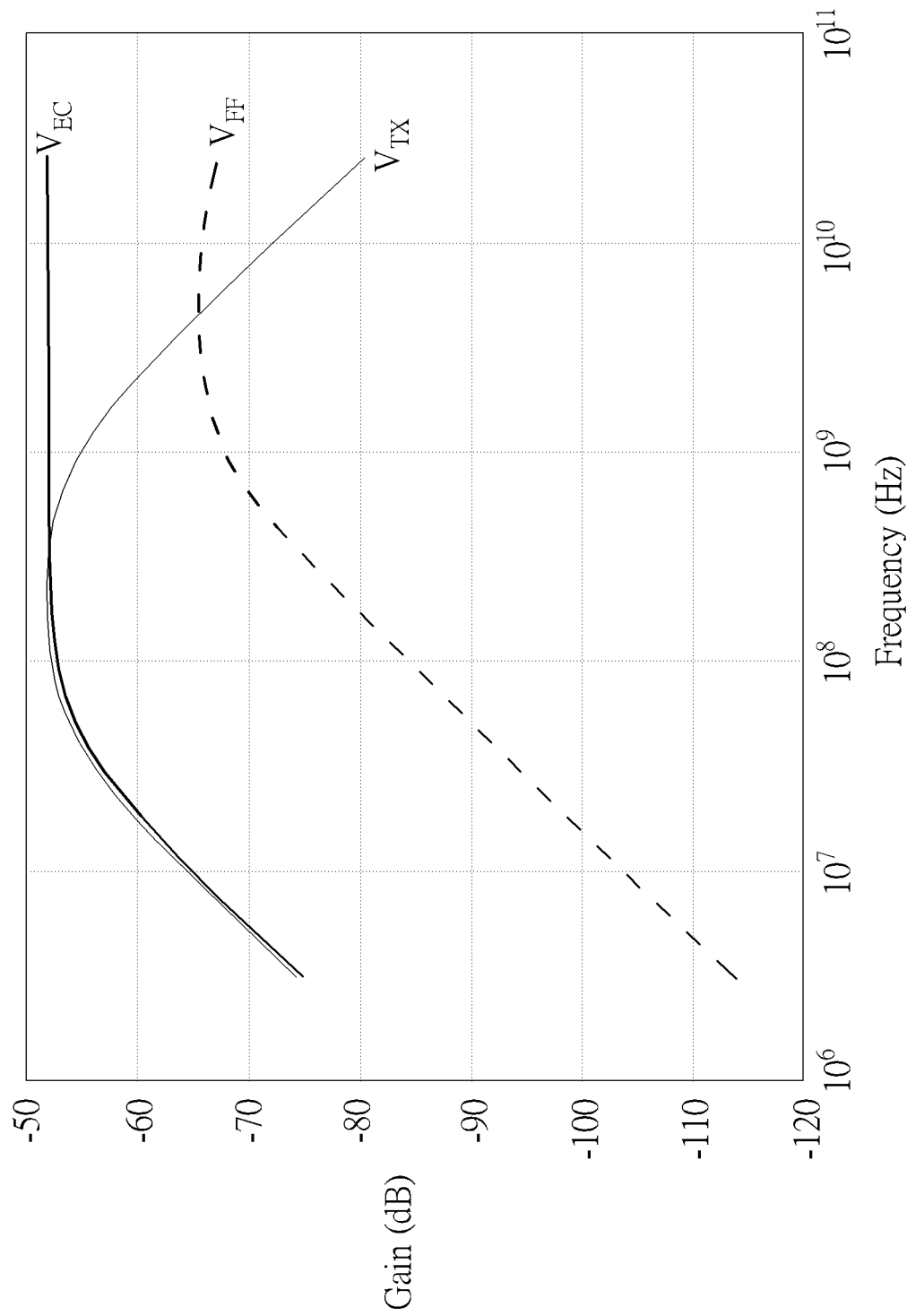
FIG. 2 illustrates relationship between signal and echo generated by the feedforward echo cancellation device according to one embodiment of the present invention.

As mentioned above, the impedance on the path from the echo cancellation current generating circuit 160 to the node 140 may affected by a control circuit 15 to a certain extent. The control circuit 15 may include a digital signal processor (not shown), and the digital signal processor can determine a signal-to-noise ratio of a programmable gain amplifier circuit 17 according to a signal output of the a programmable gain amplifier circuit 17, and/or energy of the echo signal, thereby to adjust the quantity of the echo cancellation current $I_{EC}$. Also, the control circuit 15 may changes the impedance on the path from the echo cancellation current generating circuit 160 to the node 140 to a certain extent. As such, the echo cancellation current $I_{EC}$ could approach the current $I_1$ in various frequency bands. However, as mentioned earlier, there is still an energy mismatch between the current $I_1$ and the echo cancellation current $I_{EC}$ in the high-frequency band, resulting in an unsatisfactory echo cancellation effect. Therefore, the transmission current $I_{TX}$ generated by the transmission current generating circuit 150 can also generate a current $I_2$ after passing through the second impedance circuit 120. The current $I_2$ can be applied to the node 140 to compensate the energy mismatch between the echo cancellation current $I_{EC}$ and the current I1 in the high-frequency band (as shown in FIG. 2), leading to $I_{EC} \approx I_1 + I_2$. Moreover, the impedance value of the second impedance circuit 120 is also controlled by the control circuit 15.

The local communication device 10 includes the programmable gain amplifier circuit 17 whose gain is controlled by the control circuit 15. The programmable gain amplifier circuit 17 includes a circuit module 130 and an amplifier 132. The circuit module 130 has variable impedance and is controllable by the control circuit 15. The specific structure will be described in detail later. By varying the impedance value of the circuit module 130, the gain of the programmable gain amplifier circuit 17 can be set. Furthermore, the digital signal processor in the control circuit 15 can analyze a system convergence state (e.g., by analyzing signal energy and signal swing) based on a signal output by the programmable gain amplifier circuit 17. According to the analysis result, the control circuit 15 selects a suitable gain for the programmable gain amplifier circuit 17 (i.e., changes the impedance value of the circuit module 130). The feedforward echo cancellation device 100 is disposed before an input terminal of the programmable gain amplifier circuit 17. After the feedforward echo cancellation device 100 eliminates the echo on the receiving path, the programmable gain amplifier circuit 17 amplifies the signal on the receiving path according to the current gain. After the control circuit 15 selects a proper gain for the programmable gain amplifier circuit 17, it can adjust the quantity of the echo cancellation current $I_{EC}$ so that the echo cancellation current $I_{EC}$ approaches the current $I_1$. Then, according to the impedance of the circuit module 130, the impedance of the second impedance circuit 120 is adjusted. As a consequence, the current $I_2$ is applied to the node 140, so as to compensate the energy mismatch between the echo cancellation current $I_{EC}$ and the current $I_1$ in high-frequency band.

Figure 3:
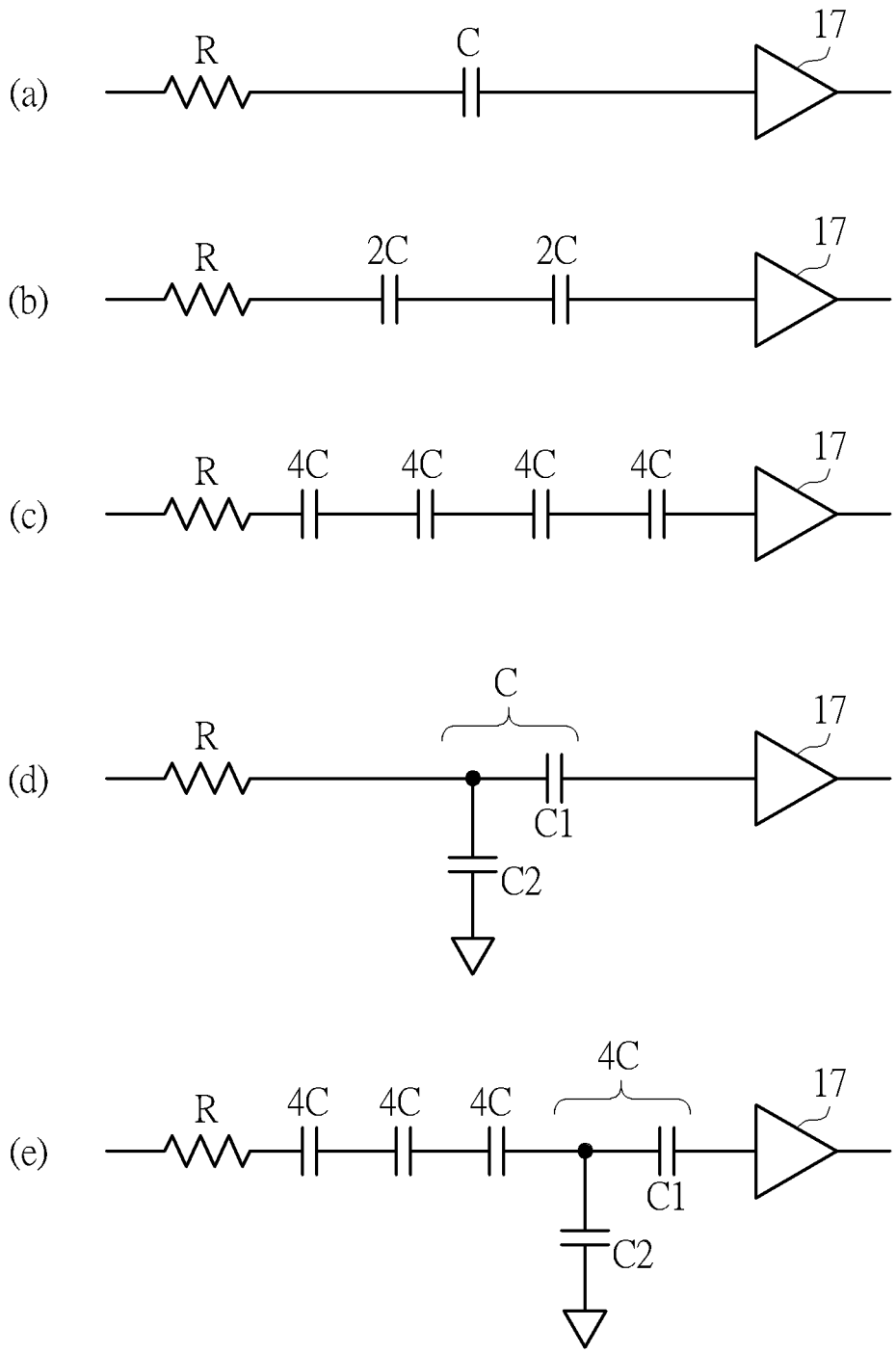
FIGS. 3-5 illustrate different implementations of a second impedance circuit in a feedforward echo cancellation device of present invention.
Figure 4:
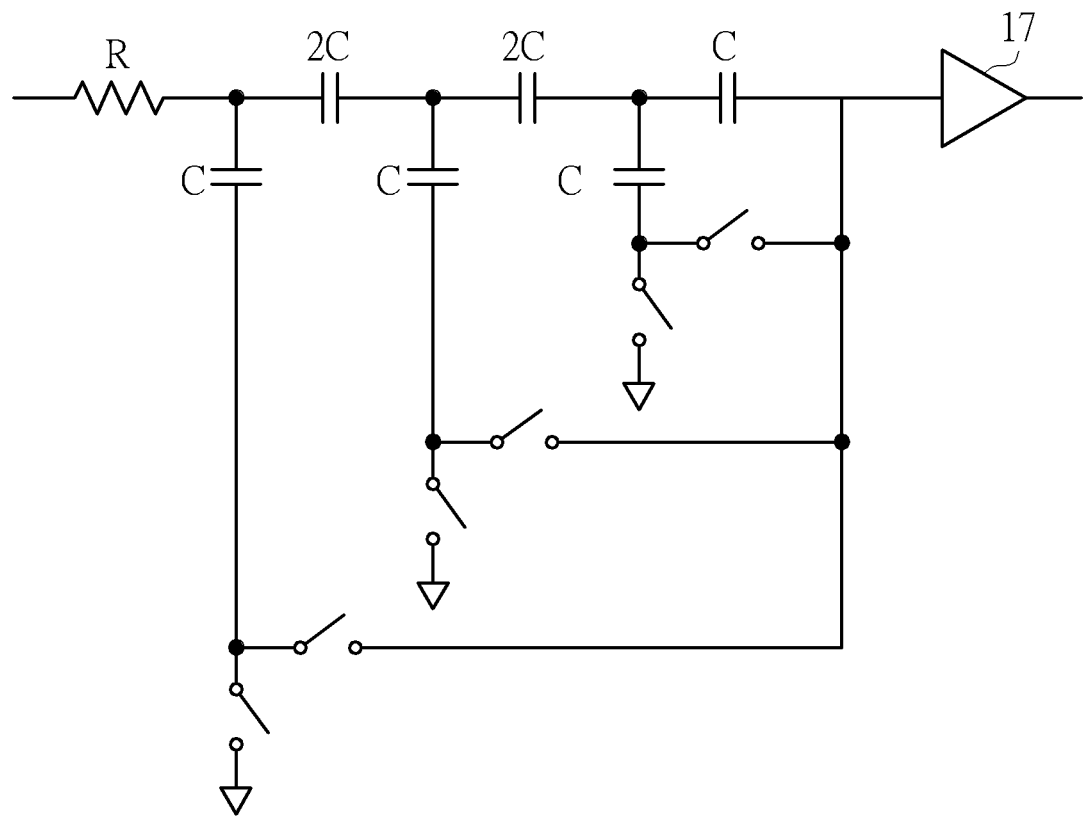
Figure 5:
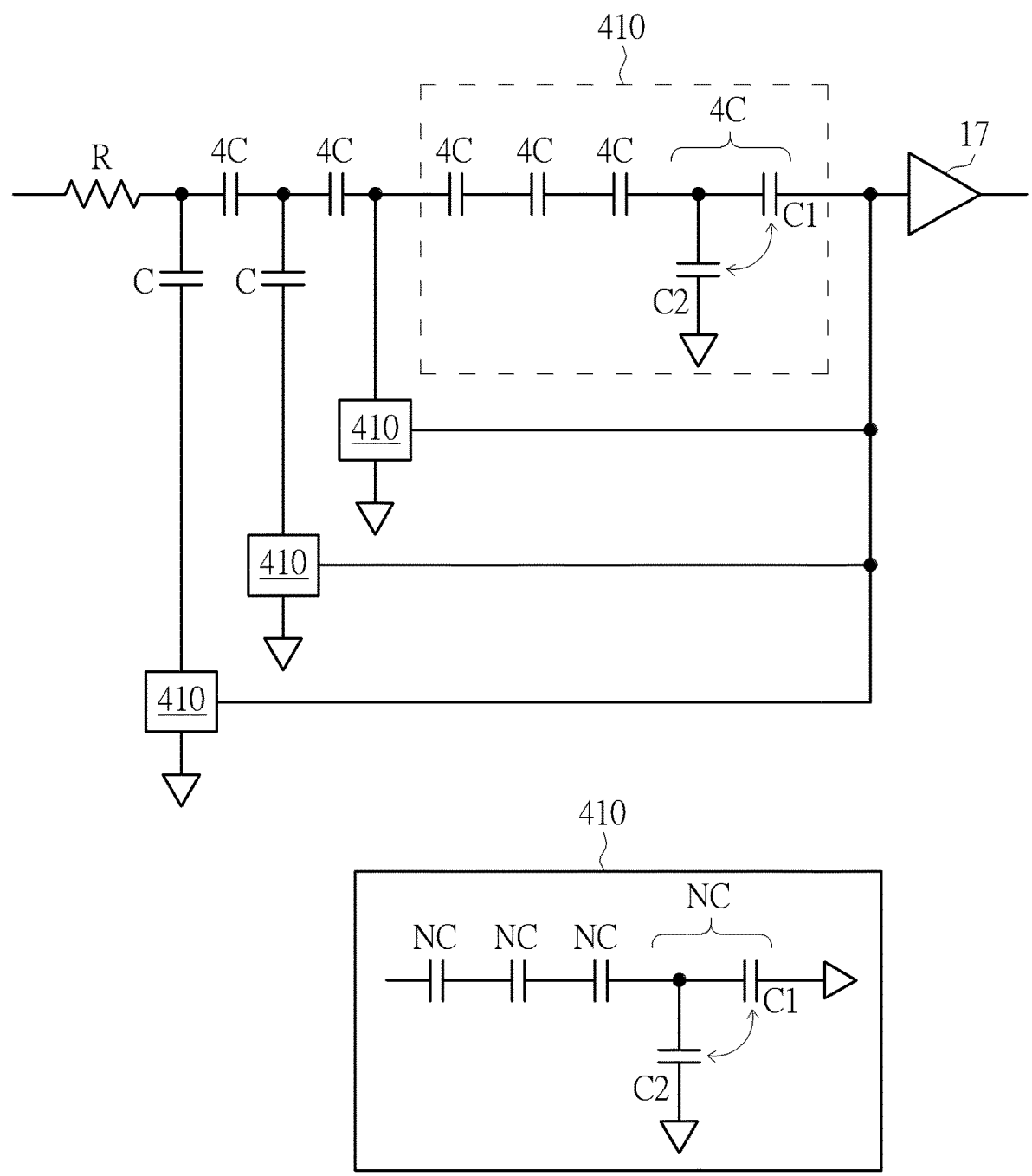

FIG. 3 further illustrates various implementations of the second impedance circuit 120 according to various embodiments of the present invention. As shown in the figure, the second impedance circuit 120 can be implemented by using a single variable capacitor with a smaller capacitance (as in implementation (a)), or using multiple variable capacitors with larger capacitances that are connected in series (such as implementations (b)-(e)). The advantage of using multiple variable capacitors with larger capacitances to implement the second impedance circuit 120 is to reduce the interference caused by parasitic capacitance. As shown in FIG. 4, a C-2C capacitor array can be used to implement the second impedance circuit 120, where an overall impedance value of the second impedance circuit 120 is controllable through switches, thereby to achieve a specific signal gain. FIG. 5 illustrates an implementation with better adjustability in impedance.

Figure 6:
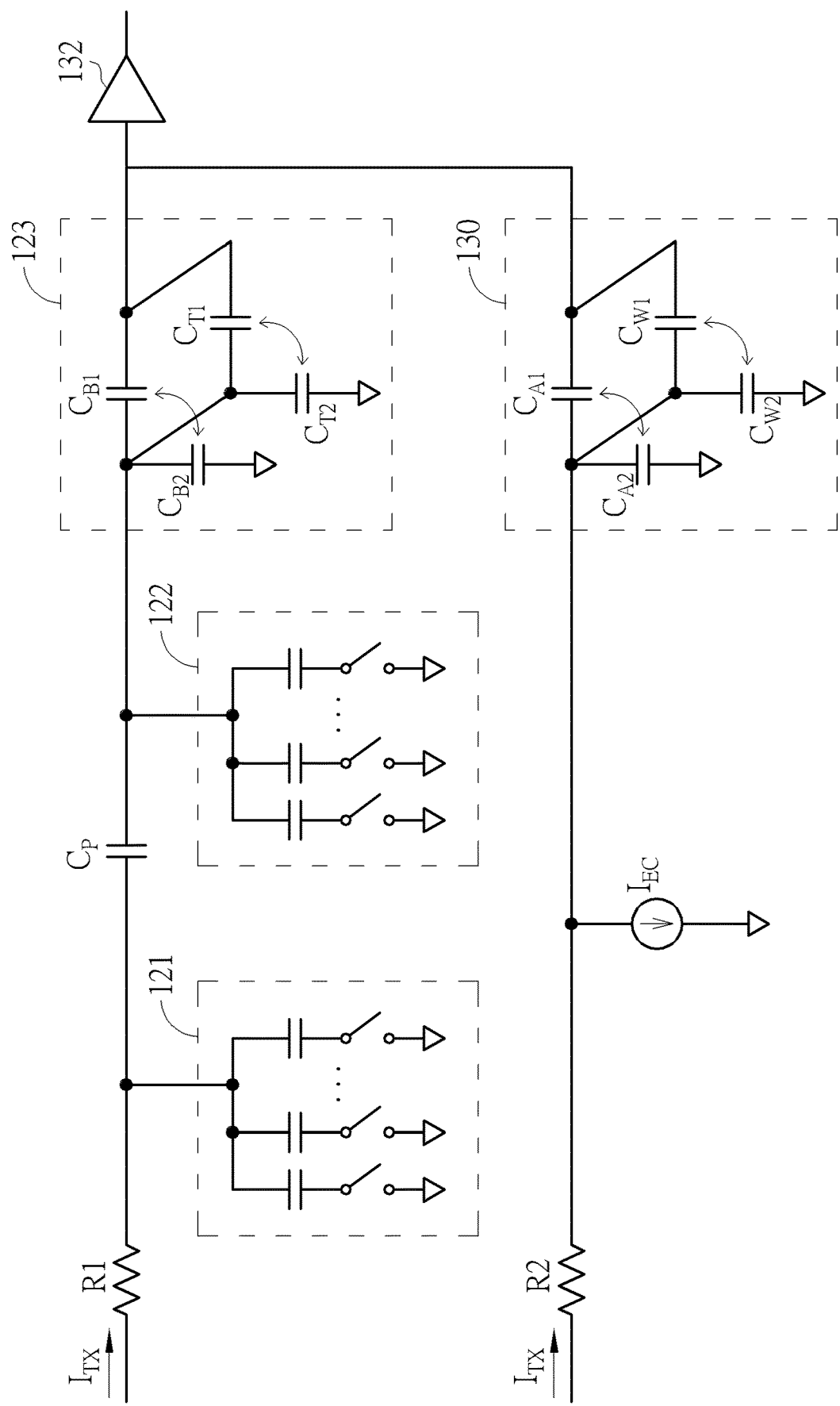
FIG. 6 illustrates another implementation of the second impedance circuit in the feedforward echo cancellation device of present invention.

FIG. 6 illustrates another implementation of the second impedance circuit 120. As shown in the figure, the second impedance circuit 120 can be implemented with a resistor R1, a capacitor network 121, 122, and 123. A resistance of a resistor R2 can be roughly considered as the impedance value of the first impedance circuit 110. The capacitor networks 121 and 122 respectively have a plurality of circuit branches connected in parallel. Each circuit branch has a capacitor and a switch connected in series. States of the switches of these circuit branches can determine the configuration of the capacitor networks 121 and 122. In this way, the capacitor networks 121 and 122 can have specific equivalent capacitance values. The configuration of the capacitor network 121 can determine a gain and a bandwidth of the local communication device 10 with respect a received signal. The configuration of the capacitor network 122 can determine a coarse gain of the local communication device 10 with respect to the received signal. During the operation of the local communication device 10, the control circuit 15 first selects a specific gain for the programmable gain amplifier circuit 17. Based on the specific gain, the control circuit 15 will determine the configuration of the capacitor networks 121 and 122 by controlling the states of the switches to adjust a bandwidth and a gain of the second impedance circuit 120. After the configuration of the capacitor networks 121 and 122 is determined, the capacitor network 123 will be adjusted along with the change in a capacitance value of the circuit module 130. In order to prevent the adjustment of the capacitor network 122 from affecting the system gain and the bandwidth that have been determined by the configuration of the capacitor network 121, this embodiment also relies on a capacitor CP that has a lower capacitance value compared to capacitors of other capacitor networks, to ensure that an RC time constant of the circuitry followed by the capacitor network 123 will not be affected by the adjustment of the capacitor network 122 and the capacitor network 123. Therefore, it can be ensured that the bandwidth determined by the capacitor network 121 will not be changed by the adjustment of the capacitor network 122 and the capacitor network 123. In addition, when the control circuit 15 adjusts the configuration of the capacitor network 121 in order to search for an optimal bandwidth of the system, it may cause the system gain to change and make the system gain deviate from the optimal gain. In view of this, the control circuit 15 can subsequently adjust the configuration of the capacitor network 122 to compensate the system gain, such that the system gain can be optimized. In some embodiments of the present invention, adjustability of the capacitor networks 121 and 122 can be implemented by architecture shown by FIGS. 3-5.

Once the control circuit 15 changes the gain of the programmable gain amplifier circuit 17, capacitance values of capacitors $C_{A1}$, $C_{A2}$, $C_{W1}$ and $C_{W2}$ in the circuit module 130 will be adjusted by the control circuit 15. When the capacitance values of the capacitors $C_{A1}$, $C_{A2}$, $C_{W1}$, and $C_{W2}$ in the circuit module 130 change, the control circuit 15 will adjust the capacitance values of the capacitors $C_{B1}$, $C_{B2}$, $C_{T1}$, and $C_{T2}$ in the capacitor network 123 accordingly. A capacitance value ratio between the capacitors $C_{B1}$ and $C_{B2}$ in the capacitor network 123 will be adjusted according to a capacitance value ratio between $C_{A1}$ and $C_{A2}$ in the circuit module 130. A capacitance value between the capacitors $C_{T1}$ and $C_{T2}$ in the capacitor network 123 will be adjusted according to a capacitance value ratio between $C_{W1}$ and $C_{W2}$ in the circuit module 130. Through such relationship, the echo cancellation effect of the feedforward echo cancellation device 100 can be guaranteed. It is noted that, in some embodiments of the present invention, the number of capacitors in the capacitor network 123 is not a limitation of the present invention. According to various embodiments of the present invention, the capacitor network 123 may only include more or fewer groups of capacitors (where the capacitors $C_{B1}$ and $C_{B2}$ can be regarded as a group of capacitors, and the capacitors $C_{T1}$ and $C_{T2}$ can be regarded as another group of capacitors). The capacitors of the circuit module 130 may also include more or fewer groups of capacitors (the capacitors $C_{A1}$ and $C_{A2}$ can be regarded as one group of capacitors, and the capacitors $C_{W1}$ and $C_{W2}$ can be regarded as another group of capacitors). When more groups of capacitors are used to implement the circuit module 130 and the capacitor network 123, a change of each adjustment on the gain would be tinier. As such, excessive instantaneous gain changes and non-convergence of the system can be avoided. In some embodiments of the present invention, the capacitor networks 121 and 122 can also be omitted. It is available to directly adjust the capacitance value of the capacitor network 123 to obtain the best system bandwidth and gain, and to eliminate the mismatch between the echo signal and the echo cancellation signal depending on the changing of the capacitance value of the circuit module 130.

Furthermore, when selecting the gain of the programmable gain amplifier circuit 17, the control circuit 15 may consider various factors, such as, external environments, temperature, and system states, to determine the impedance of the circuit module 130 and thus the gain of the programmable gain amplifier circuit 17. Therefore, as long as the control circuit 15 re-selects the gain for the programmable gain amplifier circuit 17, the impedance value of the second impedance circuit 120 and the impedance value on the path from the echo cancellation current generating circuit 160 to the node 140 will also be adjusted along with the changing of above-mentioned factors.

In summary, the feedforward echo cancellation device of the present invention compensates the energy mismatch between the echo signal and the echo cancellation signal in high-frequency band by applying a compensation signal. When eliminating the echo, the compensation signal is fed into the input terminal (i.e., node 140) of the programmable gain amplifier circuit, thus effectively alleviating the influence of the programmable gain amplifier circuit on high-frequency energy compensation. In embodiments of the present invention, the feedforward echo cancellation device is also operable to optimize the bandwidth and the gain of the whole system by utilizing multiple capacitor networks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedforward echo cancellation device for use in a communication device, wherein the feedforward echo cancellation device comprises:
   a first impedance circuit, coupled to a node, configured to output a first current to the node in response to a transmission current;
   an echo cancellation current generating circuit, coupled to the node, configured to draw an echo cancellation current from the node;
   a circuit module, coupled to the echo cancellation current generating circuit and the node, wherein a first impedance value of the circuit module is adjusted based on a system convergence index of the communication device, and the first impedance value is utilized to determine a gain of a programmable gain amplifier circuit of the communication device; and
   a second impedance circuit, coupled to the node, configured to output a second current to the node in response to the transmission current, wherein a second impedance value of the second impedance circuit is adjusted based on the first impedance value of the circuit module accordingly,
   wherein the node is coupled to an input terminal of the programmable gain amplifier circuit.

2. The feedforward echo cancellation device of claim 1, wherein the second impedance circuit further includes a first capacitor network, and a capacitance value of at least one capacitor in the first capacitor network is adjusted based on a capacitance value of at least one capacitor in the circuit module.

3. The feedforward echo cancellation device of claim 2, wherein the second impedance circuit includes a C-2C capacitor (C) array.

4. The feedforward echo cancellation device of claim 2, wherein the second impedance circuit further includes a second capacitor network, and a bandwidth and a gain of the communication device with respect to a received signal is determined by an equivalent capacitance value of the second capacitor network.

5. The feedforward echo cancellation device of claim 4, wherein the second impedance circuit further includes a third capacitor network, and a rough gain of the communication device with respect to the received signal is determined by an equivalent capacitance value of the third capacitor network.

6. The feedforward echo cancellation device of claim 5, wherein configuration adjustments of the second capacitor network and the third capacitor network are performed before a configuration adjustment of the first capacitor network.

7. The feedforward echo cancellation device of claim 5, wherein the second capacitor network and the third capacitor network respectively include a plurality of circuit branches, and each circuit branch includes a capacitor and a switch connected in series; configurations of the second capacitor network and the third capacitor network are respectively determined by states of the switches on the plurality of circuit branches.

8. The feedforward echo cancellation device of claim 1, wherein the system convergence index includes a signal-to-noise ratio or an echo signal energy.

9. The feedforward echo cancellation device of claim 1, wherein when the gain of the programmable gain amplifier circuit is determined, the first impedance value of the circuit module is adjusted according to the determined gain of the programmable gain amplifier circuit.

10. The feedforward echo cancellation device of claim 9, wherein the gain of the programmable gain amplifier circuit is determined according to a signal energy and a signal swing of a received signal of the communication device.

* * * * *